(12) United States Patent
Lin

(10) Patent No.: US 8,599,564 B2
(45) Date of Patent: Dec. 3, 2013

(54) SERVER ARCHITECTURE

(75) Inventor: Hong-Chou Lin, Taipei (TW)

(73) Assignee: Inventec Corporation, Taipei (TW)

( * ) Notice: Subject to any disclaimer, the term of this patent is extended or adjusted under 35 U.S.C. 154(b) by 336 days.

(21) Appl. No.: 13/033,816

(22) Filed: Feb. 24, 2011

(65) Prior Publication Data

US 2012/0057317 A1   Mar. 8, 2012

(30) Foreign Application Priority Data

Sep. 7, 2010   (TW) ................................ 99130165 A

(51) Int. Cl.
*H05K 7/00*   (2006.01)
(52) U.S. Cl.
USPC ............................ 361/729; 361/730; 361/752
(58) Field of Classification Search
USPC ........................... 361/728–730, 752, 796, 800
See application file for complete search history.

(56) References Cited

U.S. PATENT DOCUMENTS

| | | | |
|---|---|---|---|
| 6,147,871 A * | 11/2000 | DeWitt et al. ................. | 361/752 |
| 6,382,986 B1 * | 5/2002 | Kim et al. ....................... | 439/74 |
| 6,406,332 B1 * | 6/2002 | Buican et al. ................. | 439/631 |
| 6,491,526 B2 * | 12/2002 | Leman ............................ | 439/61 |
| 6,639,806 B1 * | 10/2003 | Chuang et al. ................ | 361/748 |
| 6,646,868 B2 | 11/2003 | Ho et al. | |
| 6,757,177 B2 | 6/2004 | Harris et al. | |
| 7,045,891 B2 * | 5/2006 | Choi ............................ | 257/723 |
| 7,072,186 B2 | 7/2006 | Hardt et al. | |
| 7,566,227 B2 * | 7/2009 | Li ................................. | 439/65 |
| 7,791,890 B2 * | 9/2010 | Ishida .......................... | 361/727 |
| 8,134,842 B2 * | 3/2012 | Orr .............................. | 361/784 |
| 8,174,835 B2 * | 5/2012 | Kim et al. ..................... | 361/737 |

\* cited by examiner

*Primary Examiner* — Hung S Bui

(74) *Attorney, Agent, or Firm* — WPAT, PC; Justin King

(57) ABSTRACT

The present invention provides a server architecture, which comprises a plurality of first middle planes disposed horizontally in the server chassis, and each of the first middle plane electrically coupled to a server board such that the server board is also horizontally disposed in the server chassis. By means of the server architecture in the present invention, in addition to providing a hot-swappable function to the server board, for the whole server system, horizontally arranged first middle plane and server board will not block the route for heat dissipating flow so that the heat dissipating efficiency with respect to the server will not be reduced.

7 Claims, 9 Drawing Sheets

SERVER ARCHITECTURE

FIELD OF THE INVENTION

The present invention relates to a server architecture, and more particularly, to a server architecture having a server board and a plurality of horizontally disposed middle planes.

BACKGROUND OF THE INVENTION

In computer networking, a server is either a software, or one or series of computers that link other computers or electronic devices together, that they are often used for providing essential services across a network, either to private users inside a large organization via Intranet or to public users via the Internet. Many servers have dedicated functionality such as web servers, print servers, e-mail servers and database servers, while the hardware requirements for servers vary, depending on the server application. Nowadays, servers' duties to provide service to many users over a network lead to different requirements like fast network connections, fast CPU for data processing, and high I/O throughput.

Please refer to FIG. 1A, which is a schematic diagram showing a conventional server architecture. As shown in FIG. 1A, a server 1 is composed of: a server board 10 or a motherboard, disposed at the rear of a server chassis; three storage devices 11, such as hard drive, disposed in the front of the server chassis; and a vertically disposed middle plane 12; in which the middle plane 12 is configured with three hot-swappable connecters 13 for connecting the three storage devices 11, and is electrically connected to the server board 10 by a signal cable 14 for enabling power and data to be transmitted between the storage devices 11 and the server board 10. Since servers often run for long periods without interruption, making hardware reliability and durability extremely important, hardware redundancy in server architecture is widely used. Accordingly, it is common to have one server being configured with more than one server board while enabling such server boards to be modualized into hot-swappable modules that can be pulgged in and out of the server without powering off the same.

Nevertheless, for modularizing a plurality of server boards 10 in to a hot-swappable module, an additional middle plane 15 that is fitted with how-swap interfaces 16 for electrically coupling to the plural server boards 10 is required, as the shown in FIG. 1B. However, since the fan 17 in the server of FIG. 1B is usually being sandwiched between the two vertically disposed middle planes 12, 15, the air flow of the fan 17 is blocked thereby and thus the heat dissipating efficiency of the fan 17 can be affected severely.

Therefore, it is in need of a server architecture capable of enabling its server boards to be hot-swappable without compromising its heat dissipating efficiency.

SUMMARY OF THE INVENTION

The primary object of the present invention is to provide a server architecture, comprising: a plurality of horizontally disposed first middle planes; and a plurality of server boards, in that each first middle plane is configured with a first electric connection interface with hot-swap ability to be used for electrically connecting to one corresponding server board selected from the plural server boards. In the aforesaid server architecture, not only the server boards are enabled to be hot-swappable, but also by the enabling the first middle planes and server boards to be horizontally disposed for preventing the same from obstructing in the path of heat dissipating air flow, the server architecture can be ensured to have a satisfactory heat dissipating efficiency.

Moreover, the present invention provides a server architecture capable of using an interface card for electrically connecting to a plurality of server boards running different server operating systems while enabling the plural server boards to be hot-swappable in a real time manner and thus adapting the server architecture for various server operating systems.

In an exemplary embodiment, the present invention provides a server architecture, comprising: a chassis; a plurality of first middle planes, each configured with a first electric connection interface with hot-swap ability and being horizontally disposed inside the chassis; and a plurality of server boards, disposed at positions corresponding to the plural first middle planes in respective and each configured with a second electric connection interface to be used for electrically connecting to the hot-swappable first electric connection interface of its corresponding first middle plane while being positioned horizontally.

In another exemplary embodiment, the present invention provides a server architecture, comprising: a chassis; a plurality of first middle planes, each configured with a first electric connection interface with hot-swap ability and being horizontally disposed inside the chassis; a plurality of server boards, disposed at positions corresponding to the plural first middle planes in respective and each configured with a second electric connection interface to be used for electrically connecting to the hot-swappable first electric connection interface of its corresponding first middle plane while being positioned horizontally; and a second middle plane, being disposed vertically inside the chassis; wherein each of the plural first middle plane is further configured with signal connectors for connecting the same electrically to the second middle plane.

Furthermore, each server board further comprises: an interface card, configured with the second electric connection interface, a first power port and a first data port; and a motherboard, configured with a second power port and a second data port in a manner that the second power port is coupled to the first power port and the second data port is coupled to the first data port.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1A:
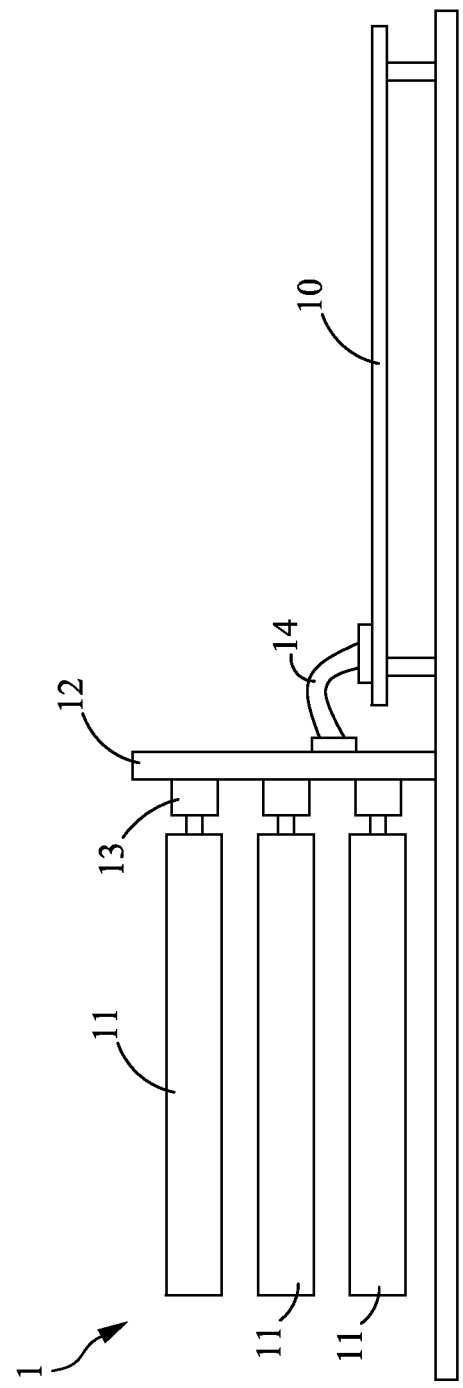
FIG. 1A and FIG. 1B are schematic diagrams showing a conventional server architecture.
Figure 1B:
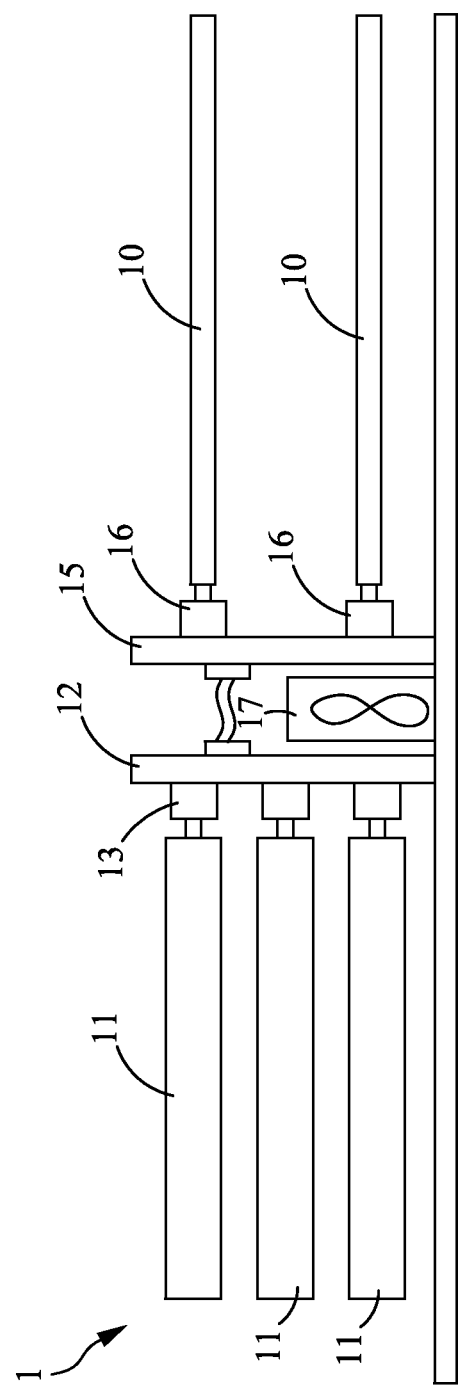
Figure 2A:
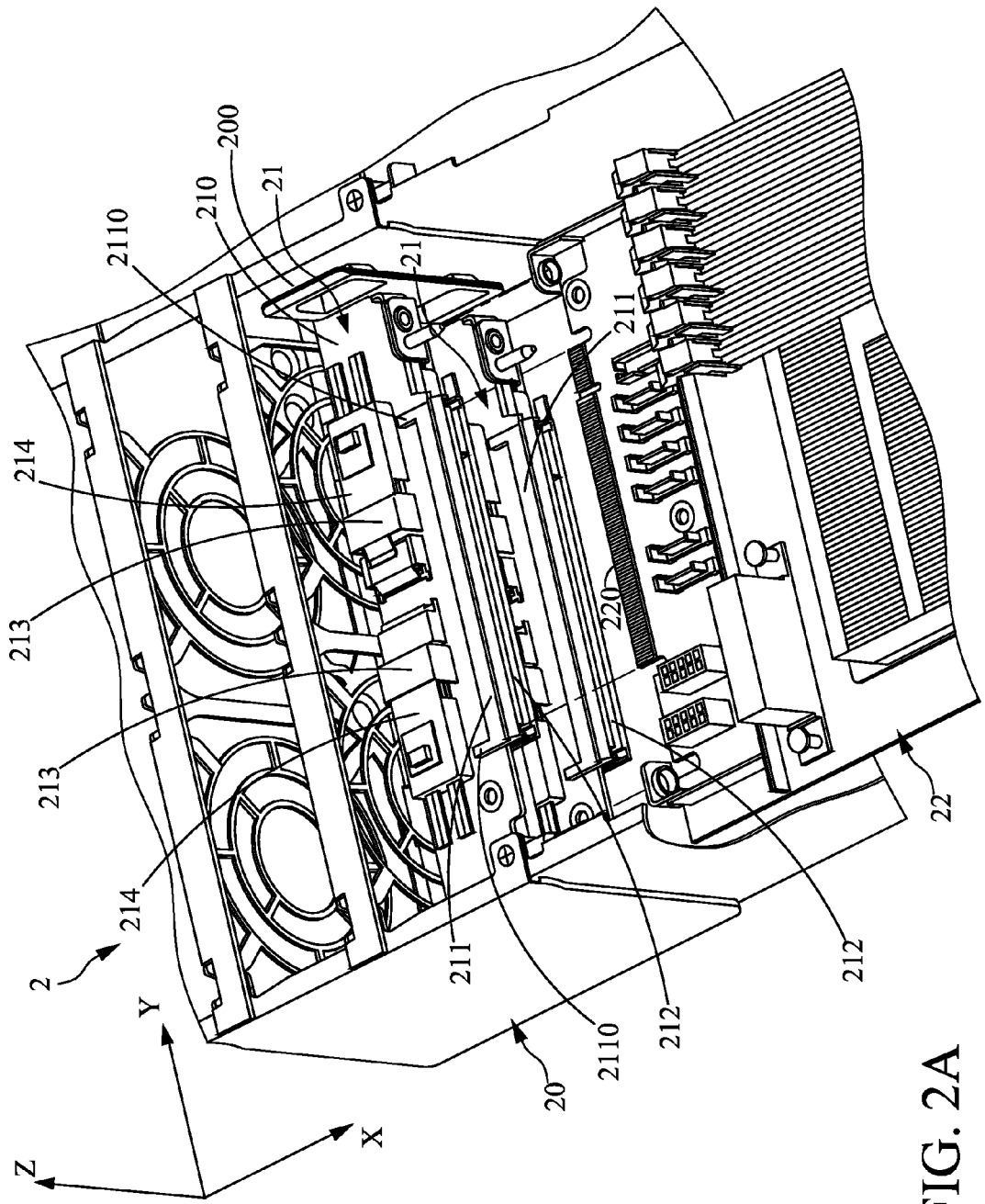
FIG. 2A is a schematic diagram showing a server architecture according to an embodiment of the present invention.
Figure 2B:
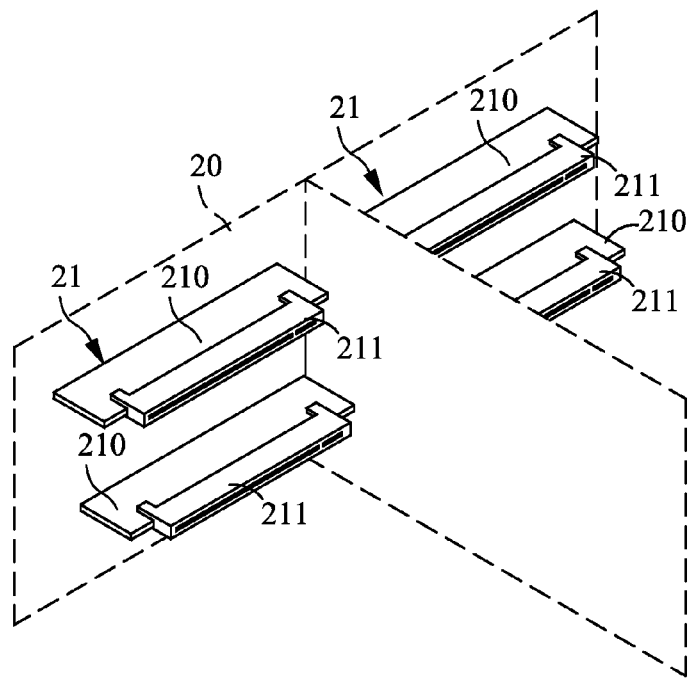
FIG. 2B and FIG. 2C are schematic diagrams showing two different ways of how the first middle planes are configured and arranged in the present invention.
Figure 2C:
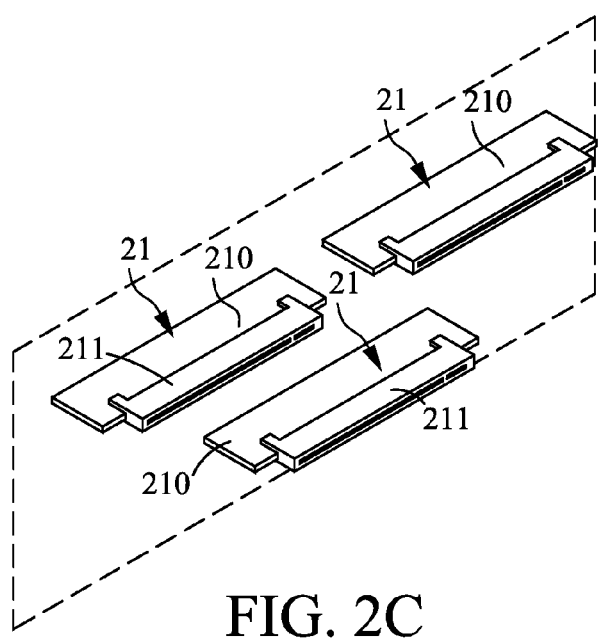
Figure 3A:
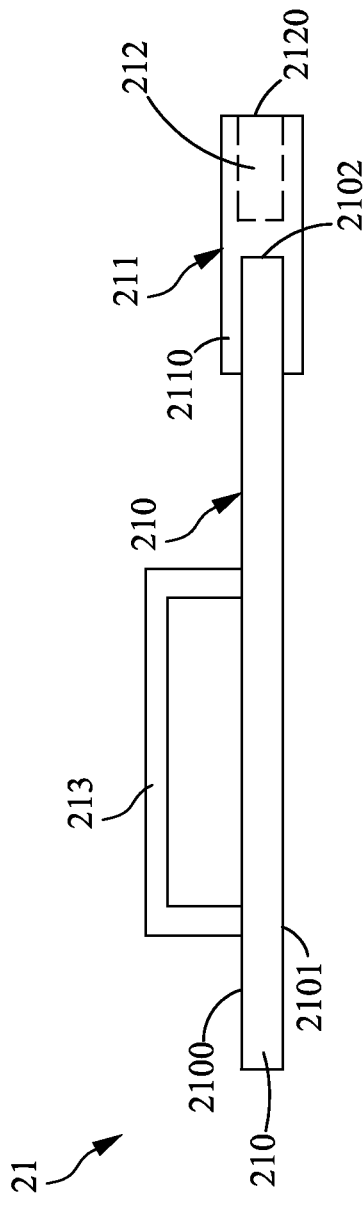
FIG. 3A is a side view of a first middle plane according to an embodiment of the invention.
Figure 3B:
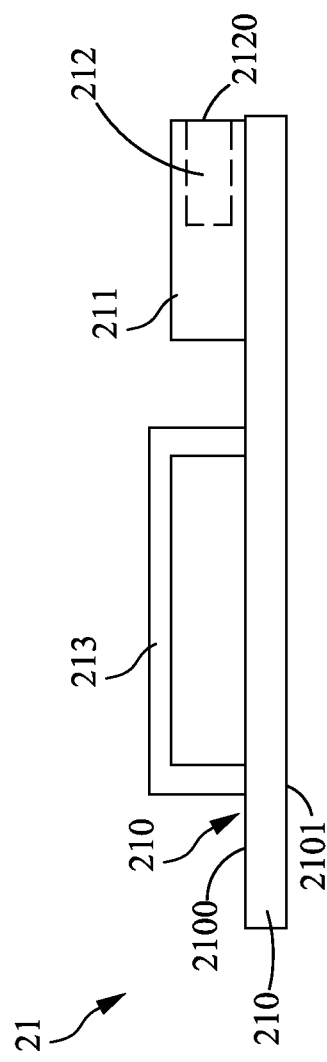
FIG. 3B is a side view of a first middle plane according to another embodiment of the invention.

Please refer to FIG. 2A, which is a schematic diagram showing a server architecture according to an embodiment of the present invention. As shown in FIG. 2A, the server architecture 2 comprises: a chassis 20, a plurality of first middle planes 21 and a plurality of server boards 22, in which the plural first middle planes are disposed inside the chassis 20 to be provided for the plural server boards 22 to plug thereto in respective. In this embodiment, the plural first middle planes 21 are disposed one on top of the other, and the amount of the first middle plane 21 being disposed inside the chassis 20 is dependent upon actual requirement. Please refer to FIG. 2B and FIG. 2C, which are schematic diagrams showing two different ways of how the first middle planes are configured and arranged in the present invention. In FIG. 2A, each of the plural first middle planes 21 is fixed to a corresponding bracket 200 that is mounted on the chassis 20 by its two ends, whereas each first middle plane 21 is composed of a circuit board 210, a first electric connection interface 211 with hot swap ability and a pair of electric connection sockets 213. As shown in FIG. 3A, the circuit board 210 is formed with a top surface 2100 and a bottom surface 2101, by that the hot-swappable first electric connection interface 211 is arranged for enabling the same to couple simultaneously with the top surface 2100 and the bottom surface 2101 by the use of clipping elements 2110. Moreover, the hot-swappable first electric connection interface 211 is formed with an electric connection slot 212 opened and parallel to a side 2102 of the circuit board 210. It is noted that the arrangement of the hot-swappable first electric connection interface 211 is not limited by the coupling of hot-swappable first electric connection interface 211 simultaneously to the top and bottom surfaces 2100, 2101, as the one shown in FIG. 3A, and thus it can be arranged by disposing the hot-swappable first electric connection interface 211 on the top surface 2100, as the one shown in FIG. 3B. Nevertheless, instead of coupling to the top surface 2100, the hot-swappable first electric connection interface 211 can be arranged on the bottom surface 2101 of the circuit board 210.

Back to FIG. 2A, the pair of electric connection sockets 213, being disposed on the circuit board 210, are coupled to the hot-swappable first electric connection interface 211 whereas each of the pair of electric connection sockets 213 is provided for a signal terminal 214 to plug therein. Generally, the signal terminal 214 is used for connecting to a storage medium while providing power to the same, and thereby, enabling data to be transmitted between the server board 22 and the storage medium. It is noted that the amount of electric connection socket 213 is determined according to actual requirement, and thus is not limited by the embodiment shown in FIG. 2A. In another exemplary embodiment, there can be only one such electric connection socket 213 being formed on the circuit board 210. Moreover, each of the plural server board 22 is arranged at a position corresponding to one of the plural first middle planes 21, whereas each server board 22 is configured with one first electric connection interface 211 that is electrically connected to the hot-swappable first electric connection interface 211 of its corresponding first middle plane 21 while being positioned horizontally. Thereby, each of the plural server boards 22 can be detached or plugged in without powering off the server architecture.

Figure 4A:
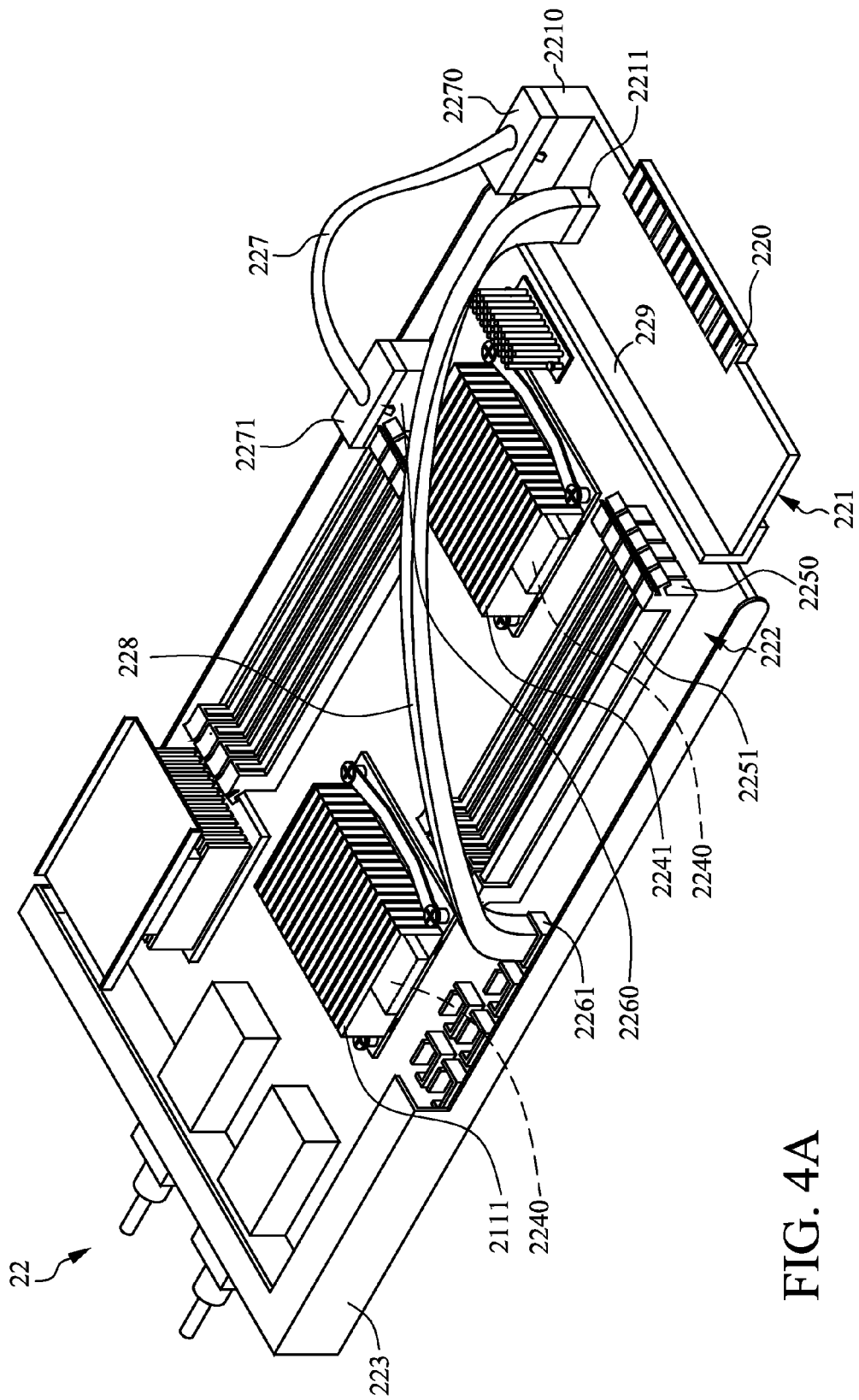
FIG. 4A is a three-dimensional diagram showing a server board according to a first embodiment of the invention.

Please refer to FIG. 4A, which is a three-dimensional diagram showing a server board according to a first embodiment of the invention. As shown in FIG. 4A, each of the plural server boards 22 further comprises: an interface card 221; and a motherboard 222. The interface card 221 is configured with a second electric connection interface 220, a first power port 2210 and a first data port 2211. It is noted the electric connection interface 220, being a goldfinger interface in this embodiment, is used as an interface for transmitting power and data at the same time. In addition, the interface card 220 is connected to the motherboard 222 by the use of a connecting rack 229. Nevertheless, the connecting of the interface card 221 to the motherboard 222 relating to how to connect the connecting rack 229 to the frame of the motherboard 222 is a known skill to those skilled in the art and thus is not described further herein.

As shown in FIG. 4A, the motherboard 222, being a device with computing ability, is received inside a frame 223. In this embodiment, there are a microprocessor 2240 and a heat dissipation module 2241 mounted on the motherboard 222, in which the microprocessor 2240 can be a processor made by either Intel or AMD; and the heat dissipation module 2241 is used for cooling the microprocessor 2240. In addition, the motherboard 222 is further being configured with a plurality of memory slots 2250 for receiving dual in-line memory modules (DIMMs) 2251. In this embodiment, the DIMM can be a memory selected from the group consisting of DRAM, DDR5 and DDR3, but is not limited thereby.

Moreover, the motherboard 222 is further configured with: a second power port 2260 and at least one second data port 2261. The second power port 2260 is electrically coupled to the first power port 2210 of the interface card 221 by a power cable 227. The power cable 227 has a first plug-in 2270 and a second plug-in 2271, in which the first plug-in 2270 is electrically connected to the first power port 2210 and the second plug-in 2271 is electrically connected to the second power port 2260. Moreover, the pins of the second plug-in 2271 can be adjusted according to the power terminal specification of the motherboard 222 for enabling the same to mate with the second power port 2260, and the adjustment of the pins of the second plug-in 2271 is performed by means of jumper wire so as to produce various types of the second plug-in 2270 for mating with different second power port 2260. Through the aforesaid adjustment, the interface card 221 is able to connected electrically with different computation platforms or various motherboards of different specifications and sizes so as to adapt the server architecture of the invention for server boards of different specifications.

Figure 4B:
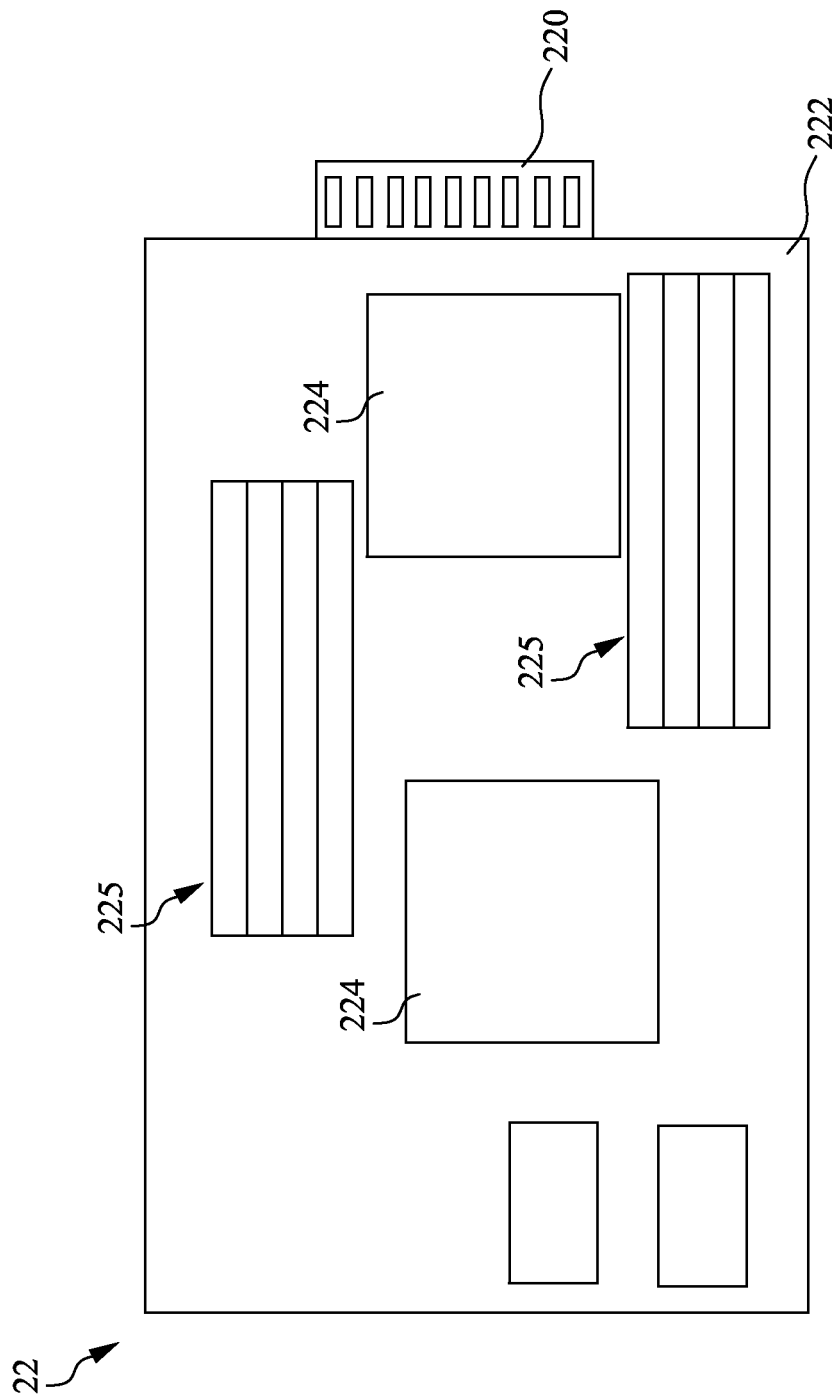
FIG. 4B is a schematic diagram showing a server board according to a second embodiment of the invention.

Moreover, the second data port 2261 is connected with the first data port 2211 by the use of a data cable 228. It is noted that there is no limitation relating to the amount of the second data port 2261 capable of being arranged on the motherboard 222, actually it can be determined according to actual requirement. In this embodiment, the first and the second data ports 2211, 2261 are both serial advanced technology attachment (SATA) interfaces, but are not limited thereby. In other embodiments, they can be small computer system interfaces (SCSI). Please refer to FIG. 4B, which is a schematic diagram showing a server board according to a second embodiment of the invention. The embodiment shown in FIG. 4B is basically the same as the one shown in FIG. 4A, but is different in that: the server board 22 used in FIG. 4B is not configured with the interface card 221, and thus the second electric connection interface 220 is connected directly to the motherboard 222.

Figure 5:
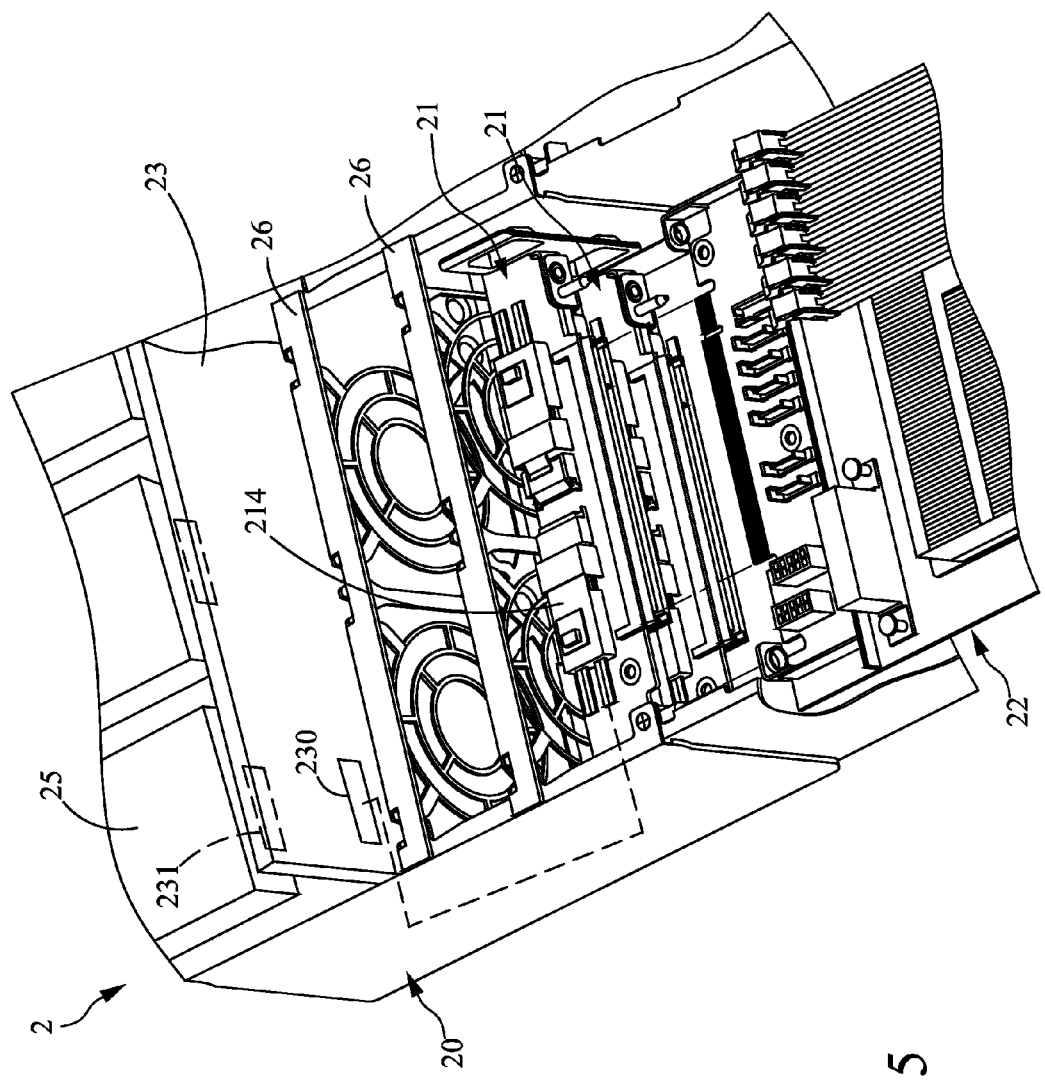
FIG. 5 is a schematic diagram showing a server architecture according to another embodiment of the present invention.
Figure 6:
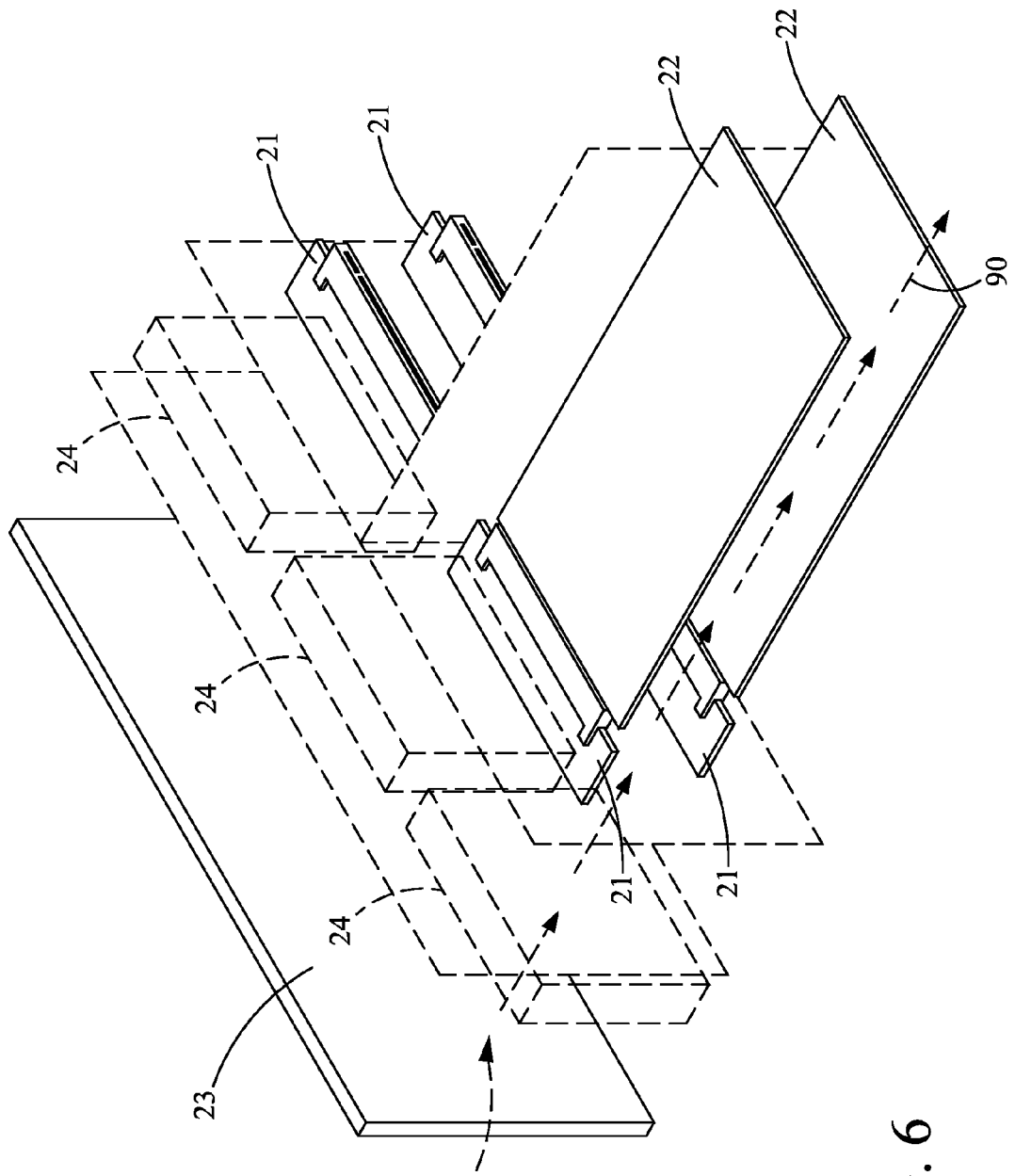
FIG. 6 is a schematic diagram showing how heat dissipating air is flowing inside a server architecture of the invention.

Please refer to FIG. 5, which is a schematic diagram showing a server architecture according to another embodiment of the present invention. In this embodiment, in addition to the components shown in the embodiment of FIG. 2A, the server architecture 2 further comprises: a second middle plane 23, that is disposed vertically inside the chassis 20, and is further configured with signal connectors 230, 231 in a manner that the signal connector 230 is connected to a signal socket 214 of the first middle plane 21 and the signal connector 231 is connected to an electric module 25, by that the electric module 25 is enabled to be hot-swappable. In this embodiment, the electric module 25 can be a storage medium, such as a hard disk drive or an optic disk drive, but is not limited thereby. In addition, there can be a frame 26 being disposed between the second middle plane 23 and the plural first middle planes 21 so as to be used for receiving a plurality of fan units therein. Please refer to FIG. 6, which is a schematic diagram showing how heat dissipating air is flowing inside a server architecture of the invention. In the embodiment shown in FIG. 6, there are at least one fan unit 24 being arranged in spaces between the second middle plane 23 and the plural first middle planes 21, and it is noted that the amount of fan units is not limited by this embodiment. Since the plural first middle planes 21 are horizontally disposed inside the chassis 20, the heat dissipating air flow induced by the at least one fan unit 24 will not be blocked thereby and thus is able to flow smoothly between gaps formed between any neighboring first middle planes 21 and/or gaps formed between the chassis 20 and its neighboring first middle planes 21 and then enter the at least one fan unit 24 where the heat dissipating air flow is blown toward the second middle plane 23 for cooling the server architecture.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A server architecture, comprising:
    a chassis;
    a plurality of first middle planes, each configured with a first electric connection interface with hot-swap ability and being horizontally disposed inside the chassis; and
    a plurality of server boards, disposed at positions corresponding to the plural first middle planes in respective and each configured with a second electric connection interface to be used for electrically connecting to the first electric connection interface of its corresponding first middle plane while being positioned horizontally; wherein each of the plural server board further comprises:
        an interface card, configured with the second electric connection interface, a first power port and a first data port; and
        a motherboard, configured with a second power port and a second data port in a manner that the second power port is coupled to the first power port and the second data port is coupled to the first data port.

2. The server architecture of claim 1, wherein each of the first electron connection interface is substantially a hot-swappable connection interface.

3. The server architecture of claim 1, wherein each of the plural first middle plane, being a circuit board having a top surface and a bottom surface, is configured for enabling its first electric connection interface to be coupled simultaneously to the top surface and the bottom surface.

4. The server architecture of claim 3, wherein each first middle plane is further configured with at least one electric connection socket, each provided for connecting electrically to the first electric connection interface of the corresponding first middle plane.

5. The server architecture of claim 1, wherein each of the plural first middle plane, being a circuit board having a top surface and a bottom surface, is configured for enabling its first electric connection interface to be coupled to the top surface.

6. The server architecture of claim 5, wherein each first middle plane is further configured with at least one electric connection socket, each provided for connecting electrically to the first electric connection interface of the corresponding first middle plane.

7. The server architecture of claim 1, wherein the electric connection interfaces are goldfinger interfaces.

* * * * *